US012317445B2

(12) United States Patent
Clark et al.

(10) Patent No.: US 12,317,445 B2
(45) Date of Patent: May 27, 2025

(54) SIMPLIFIED AIR FLOW ENHANCEMENT FOR COMPONENT COOLING

(71) Applicant: DELL PRODUCTS L.P., Round Rock, TX (US)

(72) Inventors: Emily B. Clark, Austin, TX (US); Timothy A. Shedd, Lithia, FL (US)

(73) Assignee: Dell Products L.P., Round Rock, TX (US)

( * ) Notice: Subject to any disclaimer, the term of this patent is extended or adjusted under 35 U.S.C. 154(b) by 243 days.

(21) Appl. No.: 18/296,694

(22) Filed: Apr. 6, 2023

(65) Prior Publication Data
US 2024/0341054 A1 Oct. 10, 2024

(51) Int. Cl.
*H05K 7/20* (2006.01)
(52) U.S. Cl.
CPC ................................. *H05K 7/20009* (2013.01)
(58) Field of Classification Search
CPC .................................................. H05K 7/20009
See application file for complete search history.

(56) References Cited

U.S. PATENT DOCUMENTS

| | | | |
|---|---|---|---|
| 9,648,730 B2* | 5/2017 | Harvilchuck | H05K 7/20154 |
| 2010/0294469 A1* | 11/2010 | Chou | G06F 1/20 |
| | | | 165/185 |
| 2019/0204883 A1 | 7/2019 | Chu et al. | |
| 2021/0321528 A1* | 10/2021 | Curtis | H05K 5/30 |
| 2022/0026965 A1 | 1/2022 | Chen et al. | |
| 2023/0371209 A1* | 11/2023 | Rasalingam | H05K 7/20509 |

* cited by examiner

*Primary Examiner* — Mukundbhai G Patel
(74) *Attorney, Agent, or Firm* — Larson Newman, LLP

(57) ABSTRACT

An air cooling insert for an information handling system includes a top portion and an insert portion. The insert portion is in physical communication with the top portion. The insert portion includes multiple supports and multiple twists. Each of the supports extends downward from the top portion. Each of the twists extends between two or more of the supports. The twists include first and second twists. The first twist has a first directional rotation, and the second twist has a second directional rotation. The second directional rotation is opposite the first directional rotation.

20 Claims, 7 Drawing Sheets

SIMPLIFIED AIR FLOW ENHANCEMENT FOR COMPONENT COOLING

FIELD OF THE DISCLOSURE

The present disclosure generally relates to information handling systems, and more particularly relates to a simplified air flow enhancement for component cooling.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs, and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An air cooling insert for an information handling system includes a top portion and an insert portion. The insert portion may be in physical communication with the top portion. The insert portion may include multiple supports and multiple twists. Each of the supports may extend downward from the top portion. Each of the twists may extend between two or more of the supports. The twists include first and second twists. The first twist may have a first directional rotation, and the second twist may have a second directional rotation. The second directional rotation may be opposite the first directional rotation.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
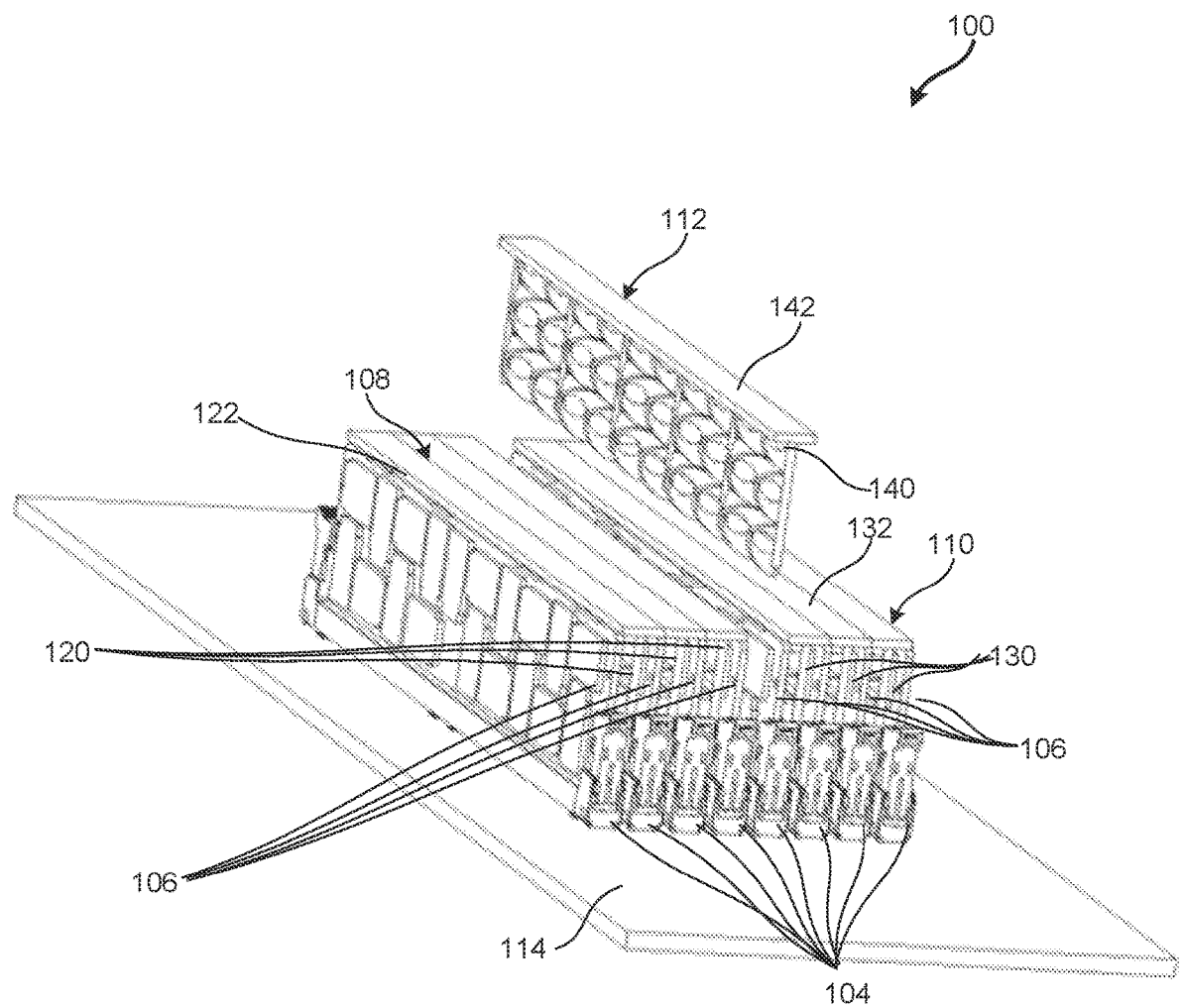
FIG. 1 is a diagram of air cooling inserts for dual in-line memory modules of an information handling system according to at least one embodiment of the present disclosure.

FIG. 1 illustrates a portion of an information handling system 100 including a simplified air flow enhancement for dual in-line memory module (DIMM) cooling according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), blade server or rack server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes a printed circuit board (PCB) 102, multiple DIMM slots 104, multiple DIMMs 106, and multiple air cooling inserts 108 and 110, and a single air cooling insert 112. In an example, PCB 102 may be any suitable board including, but not limited to, a motherboard of an information handling system, such as information handling system 900 of FIG. 9. Multiple air cooling insert 108 includes any suitable number of inserts 120 and a top portion 122. Similarly, multiple air cooling insert 110 includes any suitable number of inserts 130 and a top portion 132. Single air cooling insert 112 includes an insert 140 and a top portion 142. While multiple air cooling inserts 108 and 110 and single air cooling insert 112 will be described herein with respect to providing air cooling to DIMMs 106, the air cooling inserts may be utilized to air cooling any components, such as solid state device memories or the like, having a planar surface in an information handling system without varying from the scope of this disclosure. Information handling system 100 may include any additional components without varying from the scope of this disclosure.

In certain examples, both of multiple air cooling inserts 108 and 110 may include any suitable number of air cooling inserts, such as two, three, four, or the like. In an example, multiple air cooling inserts 108 and 110 and single air cooling insert 112 may be utilized to air cooling N+1 DIMMs 106. For example, single air cooling insert 112 may be inserted in between two DIMMs 106 and the single air cooling insert may provide air cooling to the two DIMMs. Multiple air cooling inserts 108 and 110 may include three air cooling inserts and each of the air cooling inserts may be inserted between two DIMMs 106. In this example, the three air cooling inserts of multiple air cooling inserts 108 may provide air cooling to four DIMMs 106. In certain examples, air cooling inserts may be added to or removed from multiple air cooling inserts 108 and 110 so that the multiple air cooling inserts may provide air cooling to any suitable number of DIMMs 106.

As illustrated in FIG. 1, DIMM slots 104 may be in both physical and electrical communication with PCB 102. DIMM slots 104 may also have a predefined spacing between each of the DIMM slots, such that DIMMs 106 may also have a predefined spacing between each of the DIMMs. Based on the predefined spacing between DIMMs 106, air cooling inserts of multiple air cooling inserts 108 and 110 and single air cooling insert 112 may be formed without the spacing being measured. Multiple air cooling inserts 108 and 110 and single air cooling insert 112 may be formed in any suitable material, such as an injection-molded polymer, a compressible material, metal, or the like.

In an example, inserts 120 of multiple air cooling insert 108 may be placed in physical communication with a DIMM 106 on each side of the insert. When inserts 120 are fully positioned within DIMMs 106, a bottom surface of top portion 122 may be placed in physical communication with a top surface of each DIMM 106. In certain examples, the physical communication between top portion 122 and a top surface of DIMMs 106 may prevent air flow from escaping upwards and instead force the air flow along the surfaces of the DIMMs. In an example, inserts 130 and top portion 132 of multiple air cooling insert 110 may interface with DIMMs 106 in a substantially similar manner as described with respect to inserts 120 and top portion 122 of multiple air cooling insert 108.

In certain examples, insert 140 of single air cooling insert 112 may be placed in physical communication with DIMMs 106 on each side of the insert. When insert 140 is fully positioned between DIMMs 106, a bottom surface of top portion 142 may be placed in physical communication with a top surface of both DIMM 106. In certain examples, the physical communication between top portion 142 and a top surface of DIMMs 106 may prevent air flow from escaping upwards and instead force the air flow along the surfaces of the DIMMs. In an example, top portion 142 may extend substantially half way over each DIMM 106 to prevent upward air flow and enable top portion 122 or 132 to extend half way over a corresponding 106. In another example, top portion 142 may fit within the edges of corresponding DIMMs 106 such that a physical communication between the top portion and the DIMMs may prevent air flow from escaping upwards and instead force the air flow along the surfaces of the DIMMs.

Figure 2:
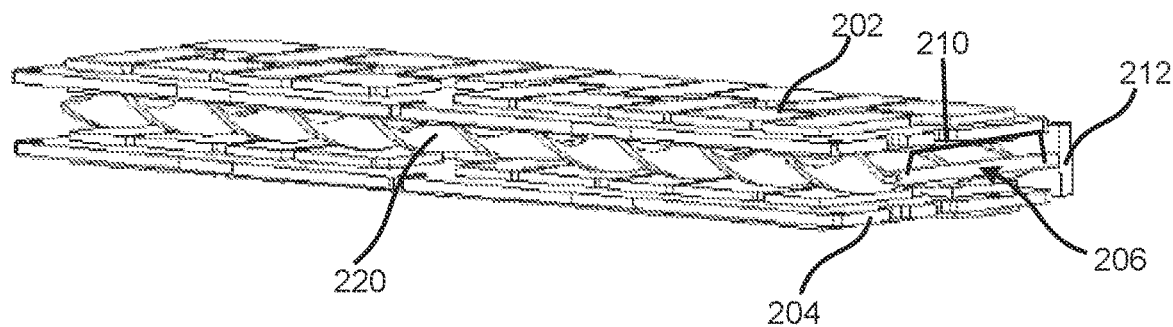
FIGS. 2 and 3 are diagrams of an air cooling insert located in between two dual in-line memory modules according to at least one embodiment of the present disclosure.
Figure 3:
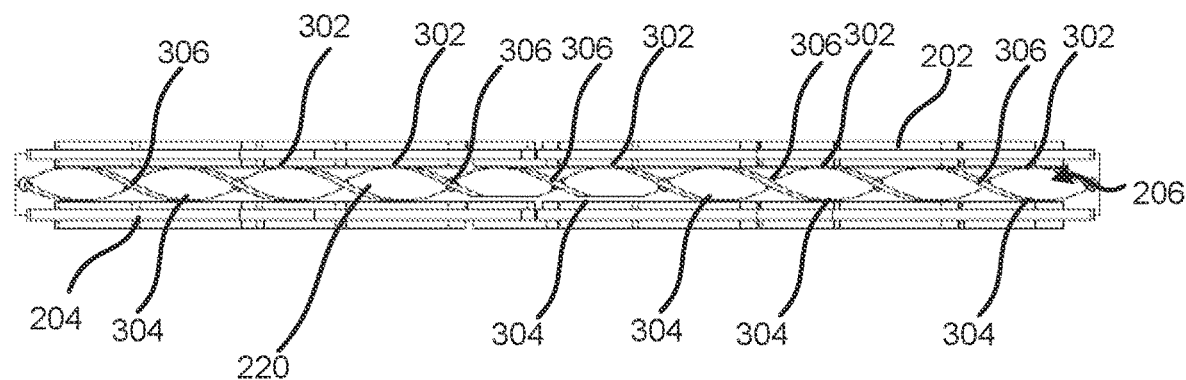

FIGS. 2 and 3 illustrate components 202 and 204 and a single air cooling insert 206 located in between the components according to at least one embodiment of the present disclosure. Components 202 and 204 may be substantially similar to DIMMs 106 of FIG. 1. Single air cooling insert 206 may be substantially similar to single air cooling insert 112 of FIG. 1. Single air cooling insert 206 includes an insert portion 210 and a top portion 212.

In an example, a first surface of insert portion 210 may be in physical communication with a surface of component 202 and a second surface of the insert portion may be in physical communication with a surface of component 204. Single air cooling insert 206 may be any suitable material and may have any suitable amount of compressibility. While insert portion 210 may be compressible, an amount that the insert portion may compress may not exceed an amount that may cause the insert portion to no longer have spirals 220.

Referring now to FIG. 3, single air cooling insert 206 is located between components 202 and 204 and different portions of spiral 220 may be in physical communication with the components. For example, spiral 220 of single air cooling insert 206 may be in physical communication with component 202 at multiple points 302, and may be in physical communication with component 204 at multiple points 304. In an example, at points 306 between points of contact 302 and 304, spiral 220 may not be in physical communication with components 202 and 204. In certain examples, spiral 220 may control the air flow between components 202 and 204 as will be described below. While air cooling insert 206 is in physical communication with components 202 and 204 at multiple points 302, the heat transfer to cool the components is from the components to the air flow. Thus, the physical communication between the components and the air cooling insert does not substantially contribute the to heat transfer and cooling of the components.

Figure 4:
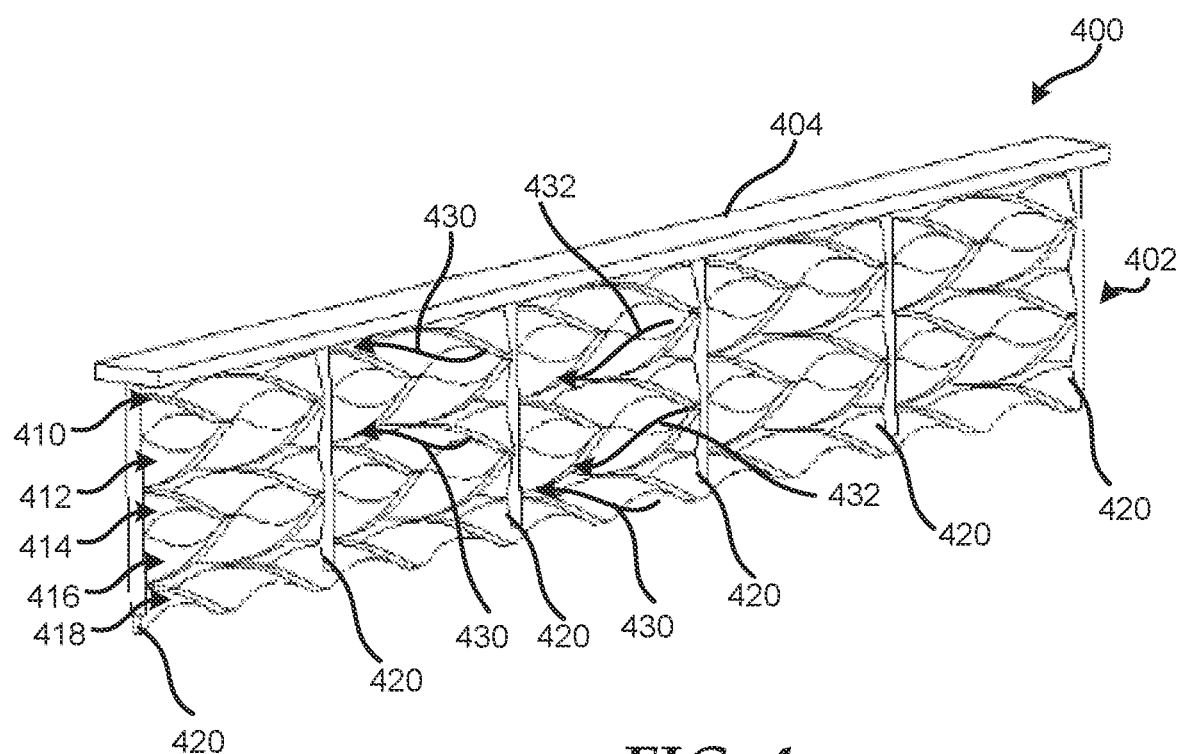
FIG. 4 is a diagram of an embodiment of an air cooling insert according to at least one embodiment of the present disclosure.

FIG. 4 illustrates an air cooling insert 400 according to at least one embodiment of the present disclosure. Air cooling insert 400 may be substantially similar to single air cooling insert 112 of FIG. 1 and air cooling insert 206 of FIGS. 2 and 3. Air cooling insert 400 includes an insert portion 402 and a top portion 404. Insert portion 402 may include any suitable number of twists including, but not limited to, twists 410, 412, 414, 416, and 418. Insert portion 402 also includes multiple supports 420 extending down from top portion 404. In an example, supports 420 may strengthen insert portion 402 and may maintain a desired distance between twists 410, 412, 414, 416, and 418. One of ordinary skill in the art will recognize that descriptions of figures having only a single air cooling insert may be applied to a multiple air cooling insert. Similarly, one of ordinary skill in the art will recognize that descriptions of figures having a multiple air cooling insert may be applied to a single air cooling insert.

In an example, twists 410, 412, 414, 416, and 418 may include any suitable number of turns from one end of insert portion 402 to the other end of the insert portion. Additionally, twists 410, 412, 414, 416, and 418 may include any suitable size of turns or twists. In an example, each of twists 410, 412, 414, 416, and 418 may rotate or turn in an opposite or counter direction with respect to a neighboring twist. For example, twist 410 may rotate in a first direction and twist 412 may rotate in an opposite or counter direction. Similarly, twist 414 may rotate in an opposite direction of twist 412, and twist 416 may be opposite of twist 414. Twist 418 may rotate in the opposite direction of twist 416. In this example, every other twist may rotate in a similar direction. For example, twists 410, 414, and 418 may twist in the same direction, and twists 412 and 416 may twist in the same direction that is opposite of the rotation for twists 410, 414, and 418. In certain examples, the counter-rotating between adjacent twists may ensure efficient air flow through air cooling insert 400.

In certain examples, rotation of twists 410, 412, 414, 416, and 418 may control air flow through air cooling insert 400. For example, twists 410, 414, and 418 may cause a first directional rotation of an air flow 430, and twists 412 and 416 may cause a second directional rotation of an air flow 432. As illustrated in FIG. 4, the directional rotations of air flows 430 and 432 may be opposite or counter to each other. In an example, the opposite directional rotations of air flows 430 and 432 may result increases air cooling of components within an information handling system.

Figure 5:
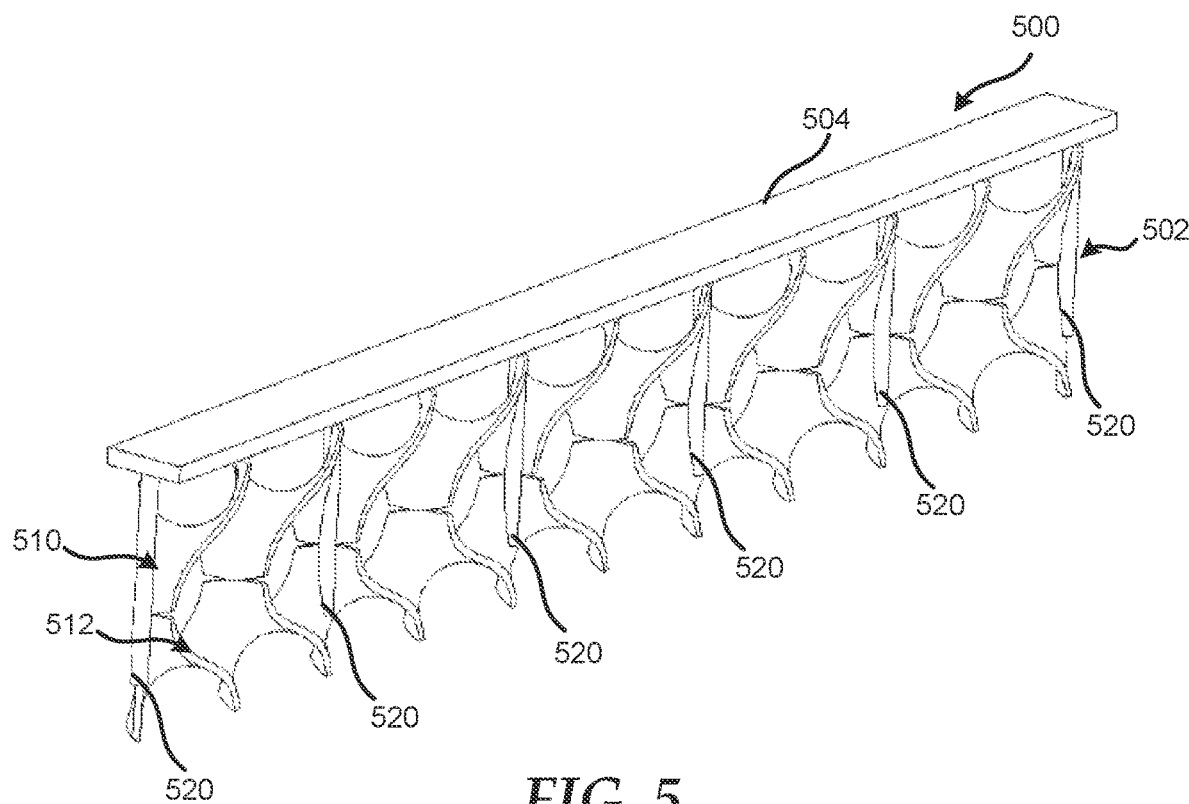
FIG. 5 is a diagram of another embodiment of an air cooling insert according to at least one embodiment of the present disclosure.

FIG. 5 illustrates an air cooling insert 500 according to at least one embodiment of the present disclosure. Air cooling insert 500 may be substantially similar to single air cooling insert 112 of FIG. 1 and air cooling insert 206 of FIGS. 2 and 3. Air cooling insert 500 includes an insert portion 502 and a top portion 504. Insert portion 502 may include any suitable number of air flow directing components including, but not limited to, a top air flow direction component 510 and a bottom air flow directing component 512. Insert portion 502 also includes multiple supports 520. In an example, supports 520 may strengthen insert portion 502 and may maintain a desired distance between top air flow direction component 510 and bottom air flow directing component 512.

In an example, insert portion 502 may include a gap between top air flow direction component 510 and bottom air flow directing component 512 to allow a particular amount of air flow to travel through the gap. In certain examples, top air flow direction component 510 may twist and slant a first direction, and bottom air flow directing component 512 may twist and slant in the opposite direction. The different directions of top air flow direction component 510 and bottom air flow directing component 512 may cause different air flows through insert portion 502.

Figure 6:
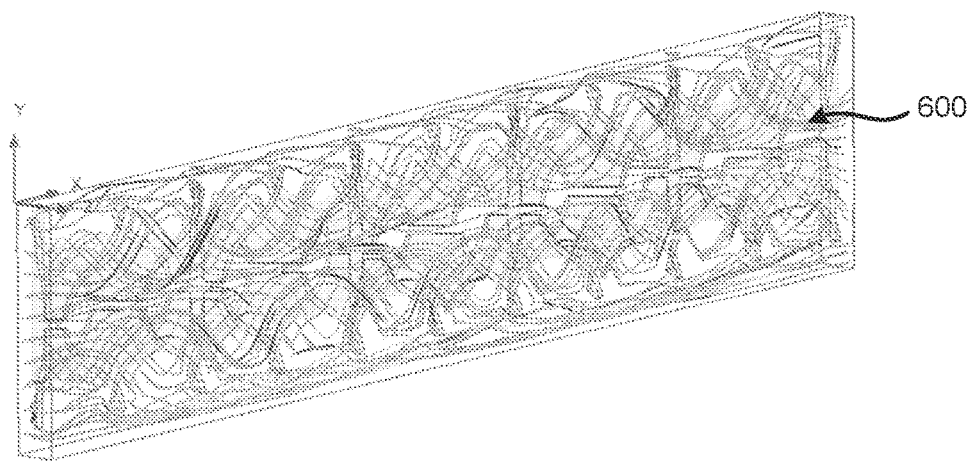
FIG. 6 is a diagram of air flow through an air cooling insert according to at least one embodiment of the present disclosure.

FIG. 6 illustrates air flow 600 through an air cooling insert according to at least one embodiment of the present disclosure. In an example, air flow 600 may be associated with multiple air cooling inserts 108 and 110 of FIG. 1, single air cooling insert 112 of FIG. 1, and air cooling insert 206 of FIGS. 2 and 3, air cooling insert 400 of FIG. 4, and air cooling insert 500 of FIG. 5.

In an example, air flow 600 may include secondary and tertiary flow structures through an associated air cooling insert, and these flow structures may significantly enhance thermal performance for planar component in an information handling system without additional surface area. In certain examples, pressure loss between the planar components may be negatively impacted, but air flow requirements may be much less than required otherwise. While multiple air cooling inserts 108 and 110 of FIG. 1, single air cooling insert 112 of FIG. 1, and air cooling insert 206 of FIGS. 2 and 3, air cooling insert 400 of FIG. 4, and air cooling insert 500 of FIG. 5 be an obstruction in a channel between components, such as DIMMs, in an information handling system, the air cooling inserts may produce a heat transfer enhancement through air flow modification.

In certain examples, multiple air cooling inserts 108 and 110 of FIG. 1, single air cooling insert 112 of FIG. 1, and air cooling insert 206 of FIGS. 2 and 3, air cooling insert 400 of FIG. 4, and air cooling insert 500 of FIG. 5 may reduce surface temperatures of components, such as DIMMs, of an information handling system by any particular amount. The amount of surface temperature reduction may include, but is not limited to, 15° C., 20° C., 30° C. or more as compared to the same air flow in an open channel. The air cooling inserts 108 and 110 of FIG. 1, single air cooling insert 112 of FIG. 1, and air cooling insert 206 of FIGS. 2 and 3, air cooling insert 400 of FIG. 4, and air cooling insert 500 of FIG. 5 may decrease a required air flow to achieve same cooling result by any particular amount, such as 3× reduction, 3.5× reduction, 4× reduction, or the like.

Figure 7:
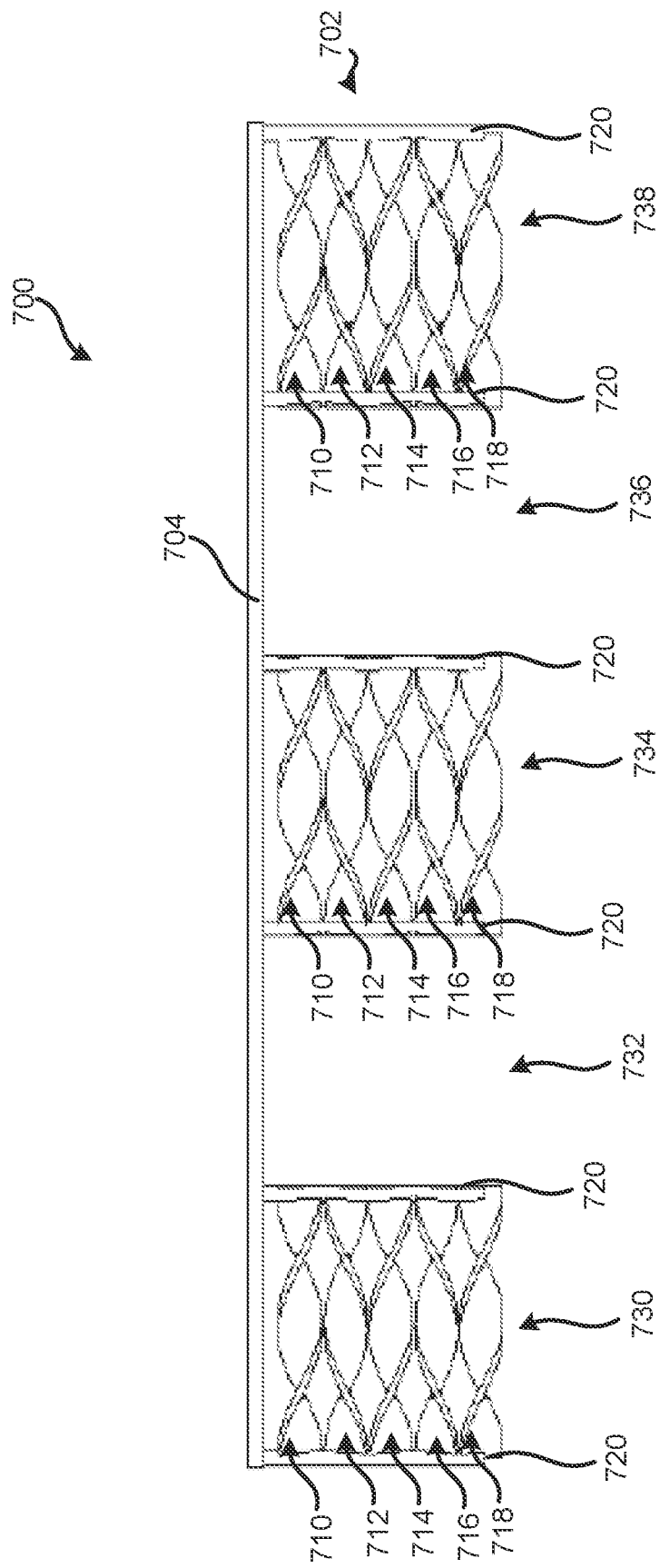
FIG. 7 is a diagram of another embodiment of an air cooling insert according to at least one embodiment of the present disclosure.

FIG. 7 illustrates an air cooling insert 700 according to at least one embodiment of the present disclosure. Air cooling insert 700 may be substantially similar to single air cooling insert 112 of FIG. 1 and air cooling insert 206 of FIGS. 2 and 3. Air cooling insert 700 includes an insert portion 702 and a top portion 704. Insert portion 702 may include any suitable number of twists including, but not limited to, twists 710, 712, 714, 716, and 718. Insert portion 702 also includes multiple supports 720 extending down from top portion 704. In an example, supports 720 may strengthen insert portion 702 and may maintain a desired distance between twists 710, 712, 714, 716, and 718.

In an example, insert portion 702 may be separated into multiple columns or sections 730, 732, 734, 736, and 738. In this example, each section 730, 732, 734, 736, and 738 may be bounded by a different support 720 on each side of the section. In certain examples, some of columns 730, 732, 734, 736, and 738 may include twists 710, 712, 714, 716, and 718 and other columns may not include the twists. For examples, columns 730, 734, and 738 may include twists 710, 712, 714, 716, and 718, and columns 732 and 738 may not include twists. In certain examples, columns 730, 732, 734, 736, and 738 may be different lengths. In an example, columns 732 and 738 without twists may be a short length, such as a length to fit around components of a DIMM. For example, column 732 may fit around a power management integrated circuit (PMIC) of a DIMM. In an example, twists 710, 712, 714, 716, and 718 may control air flow within air cooling insert 700 as described above with respect to twists 410, 412, 414, 416, and 418 of FIG. 4.

Figure 8:
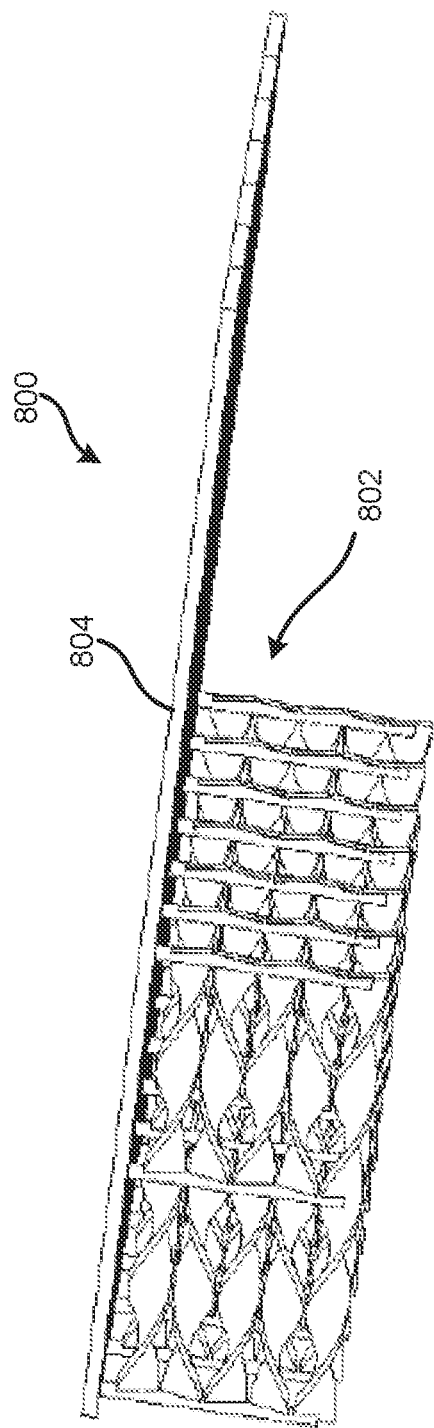
FIG. 8 is a diagram of another embodiment of an air cooling insert according to at least one embodiment of the present disclosure.

FIG. 8 illustrates an air cooling insert 800 according to at least one embodiment of the present disclosure. Air cooling insert 800 may be substantially similar to multiple air cooling inserts 108 and 110 of FIG. 1. Air cooling insert 800 includes insert portions 802 and a top portion 804. In an example, insert portions 802 may extend any suitable length along top portion 804. For example, insert portions 802 may extend a quarter of the length of top portion 804, half the length of the top portion, three-quarters of the length of the top portion, or the like. In an example, twists of insert portions 802 may control air flow within air cooling insert 800 as described above with respect to twists 410, 412, 414, 416, and 418 of FIG. 4.

Figure 9:
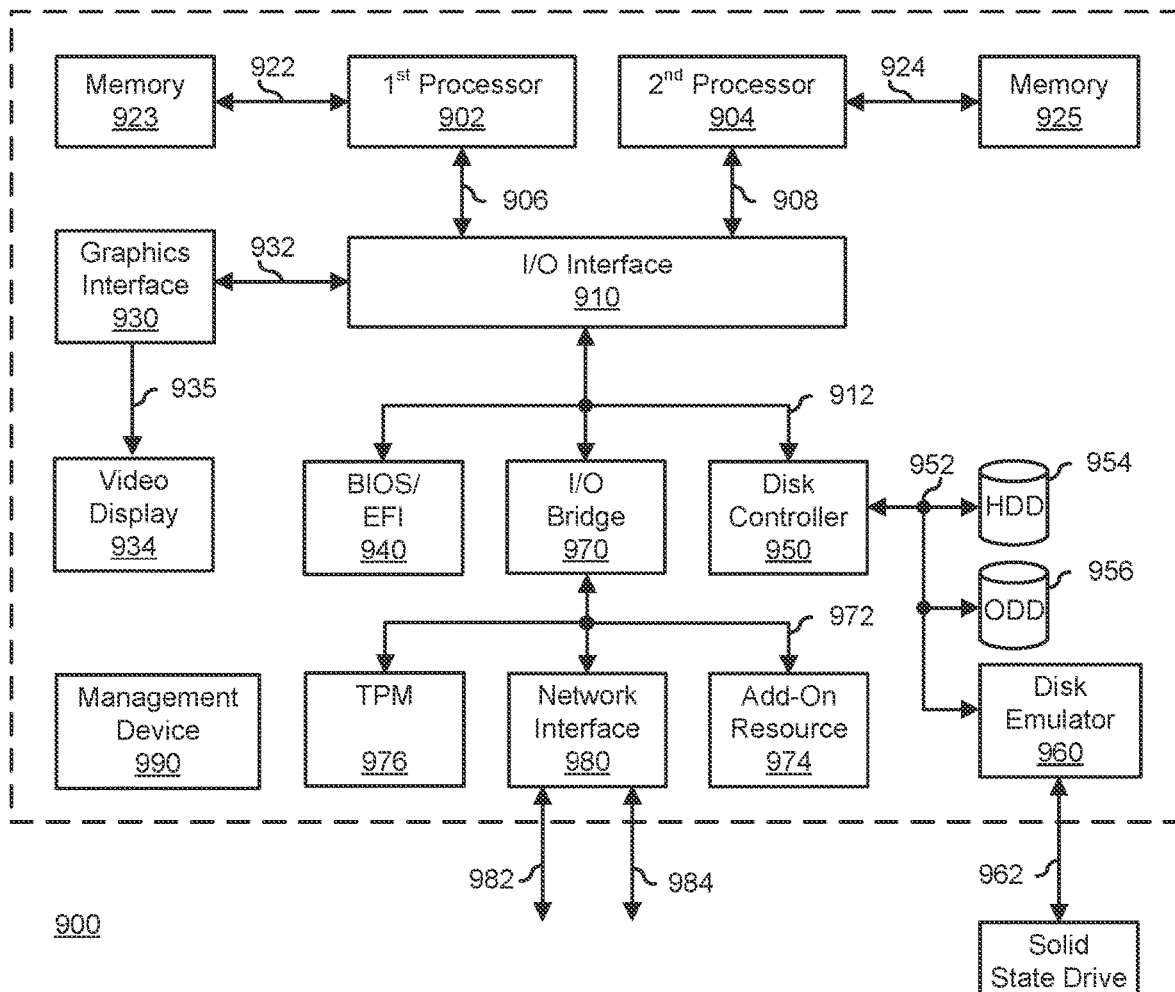
FIG. 9 is a block diagram of a general information handling system according to an embodiment of the present disclosure.

FIG. 9 shows a generalized embodiment of an information handling system 900 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 900 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 900 can include processing resources for executing machine-executable code, such as a central processing unit (CPU), a programmable logic array (PLA), an embedded device such as a System-on-a-Chip (SoC), or other control logic hardware. Information handling system 900 can also include one or more computer-readable medium for storing machine-executable code, such as software or data. Additional components of information handling system 900 can include one or more storage devices that can store machine-executable code, one or more communications ports for communicating with external devices, and various input and output (I/O) devices, such as a keyboard, a mouse, and a video display. Information handling system 900 can also include one or more buses operable to transmit information between the various hardware components.

Information handling system 900 can include devices or modules that embody one or more of the devices or modules described below and operates to perform one or more of the methods described below. Information handling system 900 includes a processors 902 and 904, an input/output (I/O) interface 910, memories 920 and 925, a graphics interface 930, a basic input and output system/universal extensible firmware interface (BIOS/UEFI) module 940, a disk controller 950, a hard disk drive (HDD) 954, an optical disk drive (ODD) 956, a disk emulator 960 connected to an external solid state drive (SSD) 962, an I/O bridge 970, one or more add-on resources 974, a trusted platform module (TPM) 976, a network interface 980, a management device 990, and a power supply 995. Processors 902 and 904, I/O interface 910, memory 920, graphics interface 930, BIOS/UEFI module 940, disk controller 950, HDD 954, ODD 956, disk emulator 960, SSD 962, I/O bridge 970, add-on resources 974, TPM 976, and network interface 980 operate together to provide a host environment of information handling system 900 that operates to provide the data processing functionality of the information handling system. The host environment operates to execute machine-executable code, including platform BIOS/UEFI code, device firmware, operating system code, applications, programs, and the like, to perform the data processing tasks associated with information handling system 900.

In the host environment, processor 902 is connected to I/O interface 910 via processor interface 906, and processor 904 is connected to the I/O interface via processor interface 908. Memory 920 is connected to processor 902 via a memory interface 922. Memory 925 is connected to processor 904 via a memory interface 927. Graphics interface 930 is connected to I/O interface 910 via a graphics interface 932 and provides a video display output 936 to a video display 934. In a particular embodiment, information handling system 900 includes separate memories that are dedicated to each of processors 902 and 904 via separate memory interfaces. An example of memories 920 and 930 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 940, disk controller 950, and I/O bridge 970 are connected to I/O interface 910 via an I/O channel 912. An example of I/O channel 912 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 910 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 940 includes BIOS/UEFI code operable to detect resources within information handling system 900, to provide drivers for the resources, initialize the resources, and access the resources. BIOS/UEFI module 940 includes code that operates to detect resources within information handling system 900, to provide drivers for the resources, to initialize the resources, and to access the resources.

Disk controller 950 includes a disk interface 952 that connects the disk controller to HDD 954, to ODD 956, and to disk emulator 960. An example of disk interface 952 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 960 permits SSD 964 to be connected to information handling system 900 via an external interface 962. An example of external interface 962 includes a USB interface, an IEEE 3394 (Firewire) interface, a proprietary interface, or a combination thereof. Alternatively, solid-state drive 964 can be disposed within information handling system 900.

I/O bridge 970 includes a peripheral interface 972 that connects the I/O bridge to add-on resource 974, to TPM 976, and to network interface 980. Peripheral interface 972 can be the same type of interface as I/O channel 912 or can be a different type of interface. As such, I/O bridge 970 extends the capacity of I/O channel 912 when peripheral interface 972 and the I/O channel are of the same type, and the I/O bridge translates information from a format suitable to the I/O channel to a format suitable to the peripheral channel 972 when they are of a different type. Add-on resource 974 can include a data storage system, an additional graphics interface, a network interface card (NIC), a sound/video processing card, another add-on resource, or a combination thereof. Add-on resource 974 can be on a main circuit board, on separate circuit board or add-in card disposed within information handling system 900, a device that is external to the information handling system, or a combination thereof.

Network interface 980 represents a NIC disposed within information handling system 900, on a main circuit board of the information handling system, integrated onto another component such as I/O interface 910, in another suitable location, or a combination thereof. Network interface device 980 includes network channels 982 and 984 that provide interfaces to devices that are external to information handling system 900. In a particular embodiment, network channels 982 and 984 are of a different type than peripheral channel 972 and network interface 980 translates information from a format suitable to the peripheral channel to a format suitable to external devices. An example of network channels 982 and 984 includes InfiniBand channels, Fibre Channel channels, Gigabit Ethernet channels, proprietary channel architectures, or a combination thereof. Network channels 982 and 984 can be connected to external network resources (not illustrated). The network resource can include another information handling system, a data storage system, another network, a grid management system, another suitable resource, or a combination thereof.

Management device 990 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 900. In particular, management device 990 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 900, such as system cooling fans and power supplies. Management device 990 can include a network connection to an external management system, and the management device can communicate with the management system to report status information for information handling system 900, to receive BIOS/UEFI or system firmware updates, or to perform other task for managing and controlling the operation of information handling system 900.

Management device 990 can operate off of a separate power plane from the components of the host environment so that the management device receives power to manage information handling system 900 when the information handling system is otherwise shut down. An example of management device 990 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 990 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An air cooling insert for an information handling system, the air cooling insert comprising:
   a top portion; and
   an insert portion in physical communication with the top portion, the insert portion including:
     a plurality of supports, wherein each of the supports extend downwardly from the top portion; and
     a plurality of twists extending between two or more of the supports, the twists including first and second twists, the first twist having a first directional rotation, and the second twist having a second directional rotation, the second directional rotation is opposite the first directional rotation.

2. The air cooling insert of claim 1, wherein the first directional rotation causes a first air flow having a third directional rotation that is substantially similar to the first directional rotation.

3. The air cooling insert of claim 2, the second directional rotation causes a second air flow having a fourth directional rotation that is substantially similar to the second directional rotation.

4. The air cooling insert of claim 1, wherein the twists further include third and fourth twists, wherein the third twist has the first directional rotation and the fourth twist has the second directional rotation, wherein the second twist is located in between the first and third twists, and the third twist is located in between the second and fourth twists.

5. The air cooling insert of claim 1, wherein the insert portion further includes: a plurality of sections, wherein each section is bounded by subsequent supports.

6. The air cooling insert of claim 5, wherein a first section of the sections includes the plurality of twists, and a second section of the sections does not include the plurality of twists.

7. The air cooling insert of claim 5, wherein the twists extend across all of the sections.

8. The air cooling insert of claim 1, wherein a first length of the insert portion is less than a second length of the top portion.

9. An information handling system comprising:
   a plurality of components; and
   an air cooling insert in physical communication with the components, the air cooling insert including:
     a top portion in physical communication with a top surface of each of the components; and
     an insert portion in physical communication with the top portion, the insert portion including:
       a plurality of supports, wherein each of the supports extend downward from the top portion; and
       a plurality of twists extending between two or more of the supports, the twists including first and second twists, the first twist having a first directional rotation, and the second twist having a second directional rotation, the second directional rotation is opposite the first directional rotation.

10. The information handling system of claim 9, wherein the first directional rotation causes a first air flow having a third directional rotation that is substantially similar to the first directional rotation.

11. The information handling system of claim 10, the second directional rotation causes a second air flow having a fourth directional rotation that is substantially similar to the second directional rotation.

12. The information handling system of claim 9, wherein the twists further include third and fourth twists, wherein the third twist has the first directional rotation and the fourth twist has the second directional rotation, wherein the second twist is located in between the first and third twists, and the third twist is located in between the second and fourth twists.

13. The information handling system of claim 9, wherein the insert portion further includes: a plurality of sections, wherein each section is bounded by subsequent supports.

14. The information handling system of claim 13, wherein a first section of the sections includes the plurality of twists, and a second section of the sections does not include the plurality of twists.

15. The information handling system of claim 13, wherein the twists extend across all of the sections.

16. The information handling system of claim 9, wherein a first length of the insert portion is less than a second length of the top portion.

17. An information handling system comprising:
first, second and third components; and
a multiple air cooling insert in physical communication with the components, the air cooling insert including:
a top portion in physical communication with a top surface of each of the components; and
a plurality of insert portions in physical communication with the top portion, the insert portions including:
a first insert portion including:
a plurality of first supports, wherein each of the first supports extend downward from the top portion; and
a first plurality of twists extending between two or more of the first supports, the first twists include first and second twists, the first twist has a first directional rotation, and the second twist has a second directional rotation, the second directional rotation is opposite the first directional rotation; and
a second insert portion including:
a plurality of second supports, wherein each of the second supports extend downward from the top portion; and
a second plurality of twists extending between two or more of the second supports, the second twists include third and fourth twists, the third twist has the first directional rotation, and the fourth twist has the second directional rotation.

18. The information handling system of claim 17, wherein the first insert portion is in physical communication with a first side surface of the first component, and with a second side surface of the second component.

19. The information handling system of claim 18, wherein the second insert portion is in physical communication with a third side surface of the second component, and with a fourth side surface of the third component.

20. The information handling system of claim 17, wherein a first length of the first insert portion is less than a second length of the top portion, and a third length of the second insert portion is less than the second length of the top portion.

* * * * *